United States Patent [19]
Peters

[11] Patent Number: 5,918,108
[45] Date of Patent: Jun. 29, 1999

[54] VERTICAL CAVITY SURFACE EMITTING LASER WITH ENHANCED SECOND HARMONIC GENERATION AND METHOD OF MAKING SAME

[75] Inventor: Frank H. Peters, Lompoc, Calif.

[73] Assignee: W. L. Gore & Associates, Inc, Newark, Del.

[21] Appl. No.: 08/923,131

[22] Filed: Sep. 4, 1997

Related U.S. Application Data

[62] Division of application No. 08/687,079, Jul. 17, 1996, Pat. No. 5,724,375.

[51] Int. Cl.$^6$ .................................................. H01L 21/20
[52] U.S. Cl. ............................................. 438/29; 438/39
[58] Field of Search ................................. 438/27, 29, 31, 438/39, 46, 47, 22; 372/46, 96, 45, 22, 59

[56] References Cited

U.S. PATENT DOCUMENTS

| | | | |
|---|---|---|---|
| 5,341,390 | 8/1994 | Yamada et al. | 372/45 |
| 5,345,456 | 9/1994 | Dai et al. | 372/22 |
| 5,363,390 | 11/1994 | Yang et al. | 372/22 |
| 5,390,210 | 2/1995 | Fouquet et al. | 372/92 |
| 5,408,110 | 4/1995 | Janz et al. | 372/22 |
| 5,422,903 | 6/1995 | Yamada et al. | 372/22 |
| 5,475,700 | 12/1995 | Iwata | 372/45 |
| 5,495,489 | 2/1996 | Lee et al. | 372/34 |
| 5,513,199 | 4/1996 | Haase et al. | 372/44 |

FOREIGN PATENT DOCUMENTS

| | | |
|---|---|---|
| 63-280484 | 11/1988 | Japan . |
| 3-126928 | 5/1991 | Japan . |
| 5-145173 | 6/1993 | Japan . |
| 8-051248 | 2/1996 | Japan . |

*Primary Examiner*—Jey Tsai
*Assistant Examiner*—S. Mulpuri
*Attorney, Agent, or Firm*—Victor M. Genco, Jr.

[57] ABSTRACT

A vertical cavity surface emitting laser is constructed on a semiconductor substrate, and includes a second mirror stack disposed on the substrate, a gain region with an active material within the second mirror stack capable of emitting electromagnetic radiation at a fundamental wavelength, a non-linear element disposed above the second mirror stack capable of emitting electromagnetic radiation at a harmonic of the fundamental wavelength in response to the electromagnetic radiation at the fundamental wavelength, and a first mirror stack disposed above the non-linear element. Electrodes are applied to the second mirror stack and the substrate for electrically pumping current into the gain region without passing through the non-linear element. A conducting layer can be disposed in the second mirror stack and an annular current confinement region can be formed in the second mirror stack around the gain region to help guide current into the active material. The gain region within the second mirror stack and the non-linear element are separated by a preselected distance. The first mirror stack is organized to be reflective of electromagnetic radiation at the fundamental wavelength and partially transmissive of electromagnetic radiation at the harmonic of the fundamental wavelength.

6 Claims, 2 Drawing Sheets

VERTICAL CAVITY SURFACE EMITTING LASER WITH ENHANCED SECOND HARMONIC GENERATION AND METHOD OF MAKING SAME

CROSS-REFERENCE TO RELATED APPLICATIONS

This application is a division of application Ser. No. 08/687,079, filed Jul. 17,1996, now U.S. Pat. No. 5,724,375.

FIELD OF THE INVENTION

This invention relates to semiconductor vertical cavity surface emitting lasers (VCSELs), and more particularly to structures and techniques providing enhanced second harmonic wavelength generation in such lasers.

BACKGROUND OF THE INVENTION

A VCSEL is a semiconductor laser consisting of a semiconductor layer of optically active material, such as gallium arsenide or indium gallium arsenide, sandwiched between mirror stacks formed of highly-reflective layers of metallic material, dielectric material, epitaxially-grown semiconductor material, or combinations thereof. Laser structures require optical confinement in an optical cavity and carrier confinement to efficiently convert pumping electrons into stimulated photons through population inversion. The standing wave of reflected electromagnetic energy in the optical cavity has a characteristic cross-section giving rise to an electromagnetic mode. A desirable electromagnetic mode is the single fundamental mode, for example, the $HE_{11}$ mode of a cylindrical waveguide.

Referring to FIG. 1, an exemplary conventional VCSEL is constructed on a GaAs semiconductor substrate 12. A second mirror stack 14 is disposed above the substrate. The second mirror stack is organized as a system of alternating layers of high and low-refractive index materials forming a distributed Bragg reflector (DBR). A gain region 16 including an active element for photon generation is disposed above second mirror stack 14 and a conducting layer 18 is disposed above the gain region. A first mirror stack 20 is located above the conducting layer. The first mirror stack is likewise organized as a system of alternating layers of high and low-refractive index materials forming a distributed Bragg reflector (DBR). The second mirror stack 14, the gain region 16, and the first mirror stack 20 form an optical resonating cavity having a central vertical axis 22.

For light emission in the wavelength range of about 600 to 1000 nanometers, the high-refractive index layers are preferably aluminum arsenide, AlAs, or aluminum gallium arsenide, AlGaAs; and the low-refractive index layers are preferably gallium arsenide, GaAs, or AlGaAs having a lower aluminum content than the high-refractive index layers. Other compound semiconductor compositions may be used for other wavelength ranges.

The mirror stacks in a VCSEL are highly reflective. The reflectivities of the mirror stacks are defined during epitaxial growth of the VCSEL by adjusting the number of periods (i.e., pairs of alternating layers of high-refractive index and low-refractive index materials) in each mirror stack. VCSELs can be either top-emitting or bottom-emitting.

In the top-emitting VCSEL shown in FIG. 1, the second mirror stack preferably has a reflectivity of greater than 99% and the first mirror stack preferably has a reflectivity of about 95–99%. The number of periods in the first mirror stack is less than that of the second mirror stack. The reflectivity of the first mirror stack is reduced to provide light emission from the VCSEL in the vertical direction as shown by arrow 24.

In a bottom-emitting VCSEL, the reflectivity of the first mirror stack is greater than the reflectivity of the second mirror stack.

A metallized contact 26 is applied to the first mirror stack 20 so that the VCSEL can be electrically pumped. Contact 26 has an annular shape and is centered about central vertical axis 22. A metallized contact 27 is applied to substrate 12, or to the second mirror stack, so that current flows through the first mirror stack, the gain region, and the second mirror stack. An annular current confinement region 28 of high electrical resistivity is located between second mirror 14 and conducting layer 18, circumscribing the gain region, and centered about central vertical axis 22. The high-resistivity current confinement region 28 channels injected current into a central portion of active region 16 for more efficient light generation therein.

Presently, commercially practical VCSELs are limited in the wavelengths of laser light they can produce. The wavelength of the laser light is determined by the active material used in the gain region of the laser. A given active material has a characteristic wavelength or wavelengths at which it will lase based on the atomic structure of the material. Of commonly used commercial materials for commercially practical VCSELs, gallium arsenide and indium gallium arsenide both can produce light with a wavelength in the infrared portion of the light spectrum. Aluminum gallium arsenide, indium aluminum gallium arsenide and indium gallium arsenide phosphorous produce light with a wavelength in the visible red portion of the light spectrum.

Because the wavelength of a laser beam determines in part how tightly the laser beam can be focused, it is often desired to produce laser light at wavelengths for which lasing materials do not exist. More specifically, it is desired to shorten the wavelength of light produced using a given active material.

A known technique for obtaining laser energy having a shorter wavelength than that characteristically produced is to utilize the non-linear interaction between light and some forms of matter to generate harmonics at multiples of the characteristic wavelength. In commercial, non-integrated lasers, a non-linear crystal is commonly employed for such non-linear interaction. As a laser beam passes through the crystal, non-linear interactions between that laser beam and the crystal generate an electromagnetic wave at half the wavelength of the laser beam. In these non-integrated lasers, the magnitude of the non-linear effect is proportional to the square of the optical power of the laser. As a result, high powered lasers which make wavelength shortening practical are needed.

SUMMARY OF THE INVENTION

The invention provides second harmonic generation in a vertical cavity surface emitting laser (VCSEL) by locating the gain region partially within the second mirror stack and by physically separating the gain region for generating the fundamental wavelength from a non-linear element included in the structure for harmonic generation by a preselected number of mirror periods. A VCSEL according to the principles of the invention includes first and second mirror stacks, a gain region, and a non-linear element, and is constructed on a semiconductor substrate. The active element in the gain region is located within the second mirror stack. The gain region together with the first and second mirror stacks define a solid resonant optical cavity. The non-linear element is interposed between the mirror stacks, in the second harmonic generation (SHG) region, within the resonant optical cavity. The non-linear element has a crystallographic orientation that matches the polarization of the electric field in the resonant optical cavity for efficient second harmonic generation. The first mirror stack is constructed to reflect electromagnetic radiation at the fundamental wavelength determined by the active material in the gain region and to pass electromagnetic radiation at a harmonic thereof as generated by the non-linear element when excited by electromagnetic radiation at the fundamental wavelength.

A conducting layer is disposed above the gain region material within the second mirror stack. A planar current confinement region, having an annular shape, is disposed within the second mirror stack and centered about the central vertical axis of the optical cavity. The current confinement region has a relatively high electrical resistivity forcing carrier movement to be within a center portion of the gain region material to achieve efficient conversion of pumping electrons into stimulated photons. Electrical contacts are formed on the top side of the second mirror stack and on the substrate (or the bottom side of the second mirror stack). The current flow between the contacts passes through the active element without passing through the non-linear element. The non-linear element therefore need not be doped resulting in greater lasing efficiency for the VCSEL.

Other features and advantages of the invention will become apparent from the following detailed description, taken in conjunction with the accompanying drawings, which illustrate, by way of example, the features of the invention.

DETAILED DESCRIPTION OF THE PREFERRED EMBODIMENT

Figure 1:
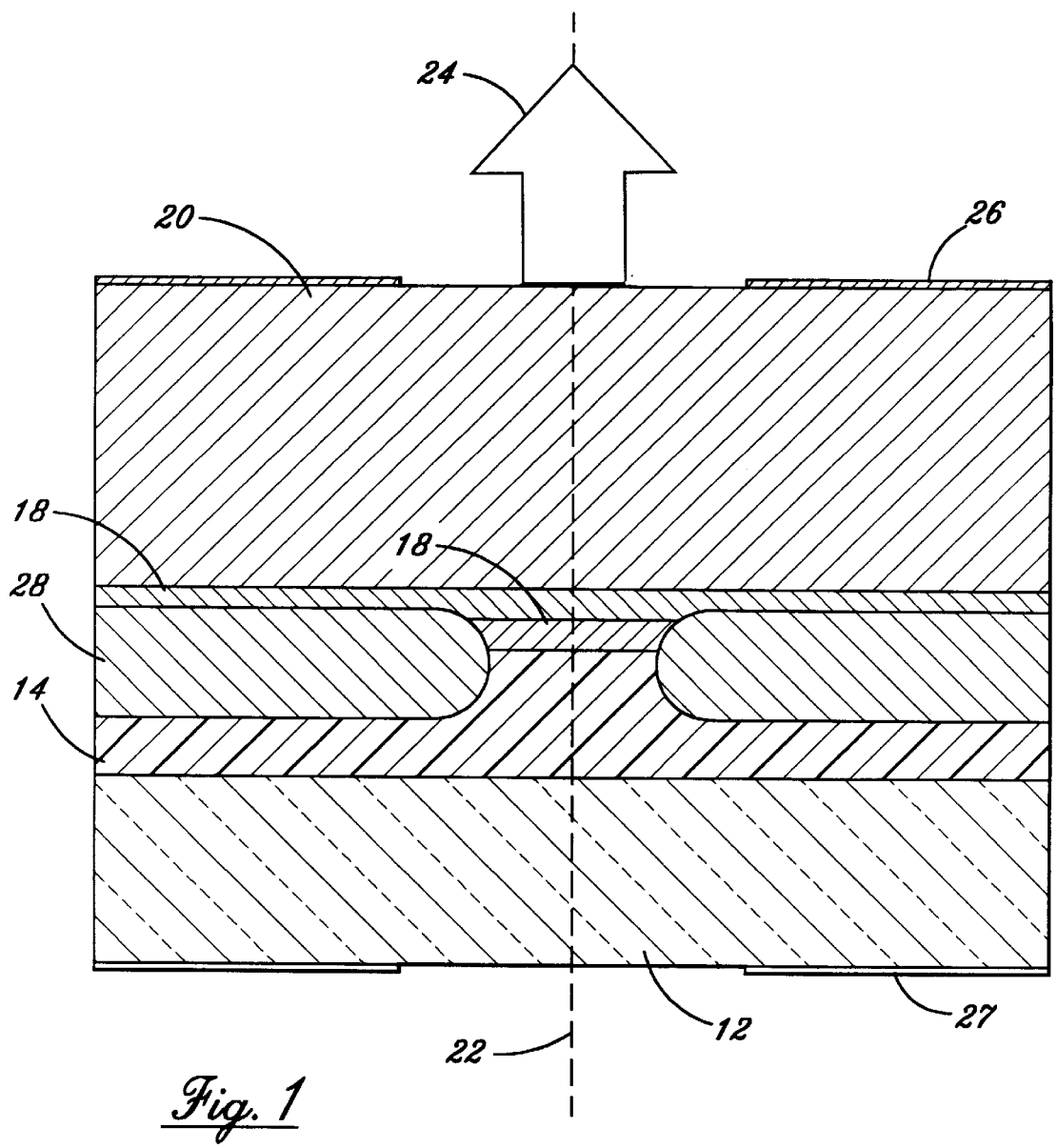
FIG. 1 is a cross-sectional elevational view of a conventional vertical cavity surface emitting laser.
Figure 2:
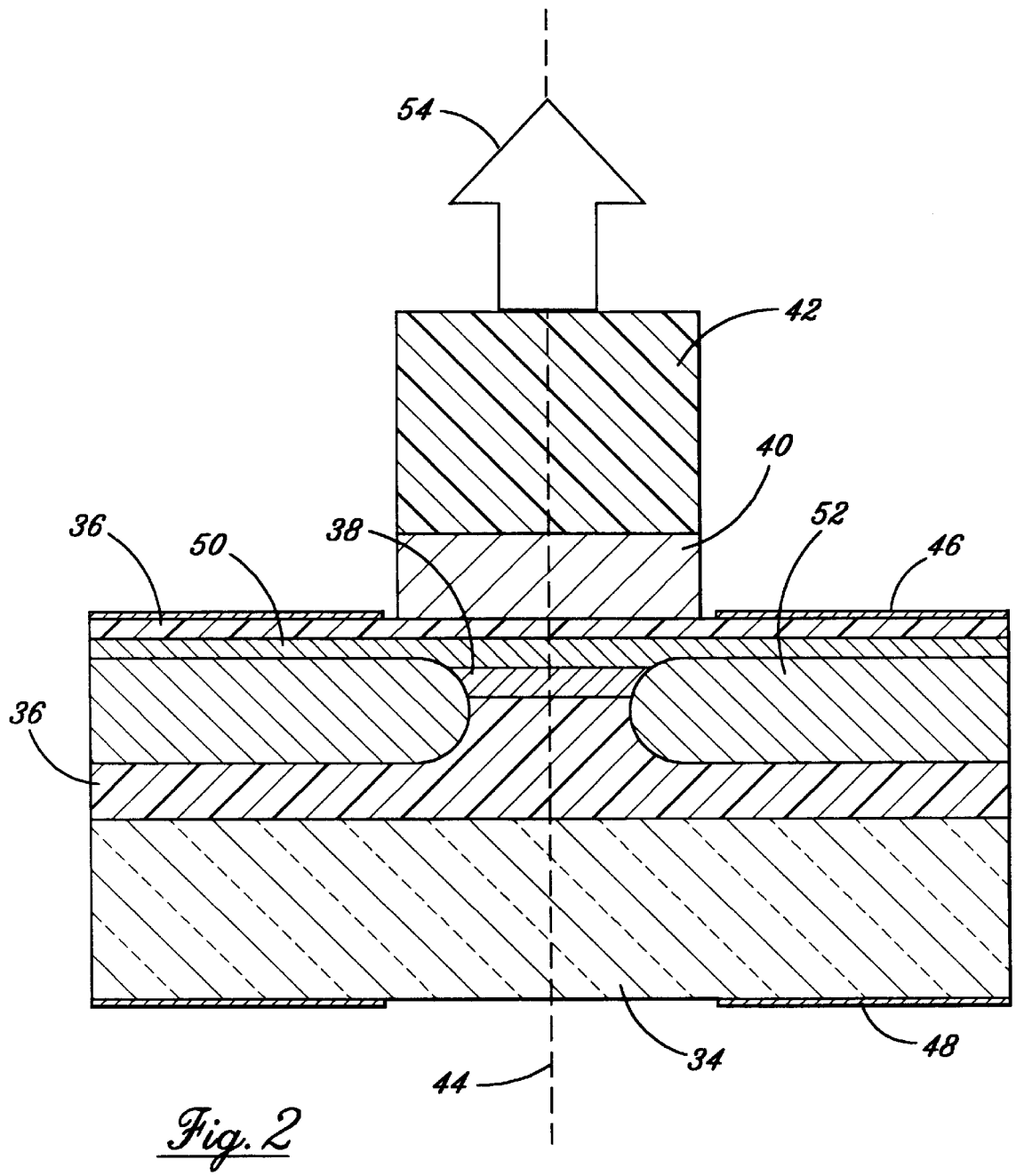
FIG. 2 is a cross-sectional elevational view of a vertical cavity surface emitting laser according to an embodiment of the invention.

Referring to FIG. 2, a vertical-cavity surface emitting laser (VCSEL) with second harmonic generation in accordance with the invention is constructed on a semiconductor substrate 34. A dielectric or semiconductor second DBR mirror stack 36 is disposed above the substrate. A gain region 38, with active material such as GaAs, is located within the second mirror stack 36. A non-linear element 40 is disposed in a second harmonic generation (SHG) region above second mirror stack 36. A dielectric or semiconductor first DBR mirror stack 42 is disposed above the non-linear element. The first and second mirror stacks, gain region 38, and non-linear element 40, form a solid resonant optical cavity having a central vertical axis 44. The active material in the gain region and the non-linear element are axially separated by a preselected number of mirror periods.

An upper metallized contact 46 is deposited on a top side of the second mirror stack 36 and circumscribes non-linear element 40. A lower metallized contact 48 is deposited on substrate 34 (or on the bottom side of second mirror stack 36). A conducting layer 50 is located within the second mirror stack above the gain region. The conducting layer funnels pumping current between contacts 46 and 48 through the active gain region.

Non-linear element 40 is a thin-slice crystalline material such as lithium niobate, gallium arsenide, aluminum arsenide, aluminum gallium arsenide, barium titanate, zinc selenide, or equivalent. The non-linear element presents a crystallographic orientation that matches the polarization of the electric field in the resonant optical cavity for efficient second harmonic generation. The non-linear element may be deposited on second mirror stack 36 before the dielectric or semiconductor first mirror is grown. The non-linear element may be deposited epitaxially or attached by wafer fusion. Alternatively, the non-linear element may be deposited by van der Waals bonding, a process in which dissimilar materials are attracted due to their small size. The wafer fusion process involves creating clean surfaces, then forcing the surfaces together under pressure at high temperatures (~300° C.), in a neutral environment. The wafer fusion process creates a physical bond between different materials.

First mirror 42 functions as a refractive index waveguide which constrains the electromagnetic field and defines the radial optical mode profile (relative to central vertical axis 44). The axial mode of the electromagnetic field in the optical cavity (measured along central vertical axis 44) is defined by the spacing of the reflective surfaces that make up the first and second mirror stacks.

Conventionally, an optical cavity is characterized by a distributed reflector induced standing wave pattern. In the conventional distributed reflector standing wave pattern the active region is placed at the maximum in the standing wave pattern and optically-absorptive elements are located at nulls (or minimums).

In contrast, however, a detuned gain arrangement is used according to the preferred embodiment of the invention. With this detuned gain arrangement, gain region 38 is positioned in the second mirror stack away from the standing wave maximum in the optical cavity. Such detuning, that is, locating gain region 38 inside second mirror stack 36, makes generation of electromagnetic radiation at the fundamental wavelength less efficient. However, this loss of efficiency is more than compensated by enhancing the ability of the optical cavity to generate electromagnetic radiation at the second harmonic.

In the detuned optical cavity according to the invention, gain region 38 is incorporated into second mirror stack 36 and is physically and electrically displaced from non-linear element 40. In the preferred embodiment of the invention this enables visible emission of electromagnetic radiation at the second harmonic (e.g., blue light) more efficiently than in conventional designs.

Another feature of the preferred embodiment of the invention is the selected axial separation between the gain region and the non-linear element. The physical separation electrically decouples the gain region from the non-linear element. Electrical contacts can therefore be deposited so current can be injected into the gain region without passing through non-linear element 40. The non-linear element therefore can remain undoped. The amount of doping in a VCSEL affects free carrier losses in the VCSEL. By eliminating doping from the high field region the efficiency of the VCSEL is increased. The decoupling also makes it possible to use other nonlinear optical materials integrated into the optical cavity via wafer fusion or van der Waals bonding.

In operation, current is pumped from upper contact 46 through conducting layer 50 into gain region 38 within the second mirror stack. Current confinement layer 52 concentrates the current toward the center of the gain region. Current flows out of the gain region through second mirror stack 36 and substrate 34 to lower contact 48. The current pumped through the gain region causes photon emission at a fundamental wavelength which is characteristic of the optically active material in region 38 (e.g., GaAs). The first and second mirror stacks reflect these photons back through gain region 38 causing constructive reinforcement of the photons until the material achieves the population inversion inducing coherent emission.

The optical field strength (Q) between the first and second mirror stacks is very high, on the order of 1,000 times that of the emitted laser light. As the photons pass through non-linear element 40, some interact with the non-linear material and generate electromagnetic radiation at a second harmonic of the fundamental wavelength. The amount of second harmonic wavelength electromagnetic radiation generated is proportional to the square of the optical field intensity and the square of the length of the non-linear element.

In a VCSEL, the ideal location for the gain region where the active element injects energy into the laser at the fundamental wavelength is between the first and second mirror stacks. This is also the ideal location for the non-linear element in the SHG region which generates the harmonics. According to the invention, the gain region is detuned somewhat by moving the gain region into one of the mirrors. Detuning the gain region in this fashion makes the fundamental light generation less efficient. However, this loss of efficiency is more than compensated by enhancement of the second harmonic generating potential.

Shifting the gain region for the fundamental into the second mirror stack physically and electrically separates the gain region from the non-linear element. As a result, current can be injected through the second mirror stack and through the active gain region without passing through the non-linear element. The non-linear element in the SHG region can therefore remain undoped since it no longer affects free carrier losses in the structure. By eliminating doping in the high field region between the mirror stacks, the lasing efficiency is greatly increased. Also, since the non-linear SHG element does not require doping, many additional non-linear materials can be considered for the second harmonic generation, i.e., non-linear elements which cannot be doped.

Both the first and second mirror stacks are designed to reflect electromagnetic radiation at the fundamental wavelength. First mirror 42 is designed to reflect only a fraction of the generated electromagnetic radiation at the second harmonic so that a substantial percentage of the coherent electromagnetic radiation at the second harmonic wavelength passes upward through first mirror 42 and is emitted from the VCSEL as shown by arrow 54.

While several particular forms of the invention have been illustrated and described, it will also be apparent that various modifications can be made without departing from the spirit and scope of the invention.

What is claimed is:

1. A method for constructing a vertical cavity surface emitting laser with enhanced harmonic generation, comprising the following steps:

(A) providing a semiconductor substrate;

(B) depositing a second mirror stack on said substrate;

(C) integrating within said second mirror stack an active material in a gain region capable of emitting radiation at a fundamental wavelength;

(D) locating a non-linear element for generating electromagnetic energy at a harmonic of said fundamental wavelength above said second mirror stack;

(E) depositing a first mirror stack above said non-linear element; and (F) depositing contacts above and below said second mirror stack and said substrate for injecting current into said gain region.

2. The method of claim 1, further comprising the step:

disposing a conducting layer above said gain region within said second mirror stack.

3. The method of claim 1, further comprising the step:

organizing said first mirror stack to be reflective of electromagnetic radiation at said fundamental wavelength and to be partially transmissive of electromagnetic radiation at a harmonic of said fundamental wavelength.

4. The method of claim 1, wherein:

said non-linear element is secured to said second mirror stack by wafer fusion.

5. The method of claim 1, wherein:

said non-linear element is bonded to said second mirror stack by van der Waals forces.

6. The method of claim 1, wherein:

said second mirror stack presents an epitaxial surface, and said non-linear element is grown on said epitaxial surface of said second mirror stack.

* * * * *